(12) United States Patent
Wu et al.

(10) Patent No.: US 12,094,954 B2
(45) Date of Patent: Sep. 17, 2024

(54) METHOD FOR MANUFACTURING DISPLAY SUBSTRATE

(71) Applicants: Ordos Yuansheng Optoelectronics Co., Ltd., Inner Mongolia (CN); BOE Technology Group Co., Ltd., Beijing (CN)

(72) Inventors: Xinguo Wu, Beijing (CN); Fengguo Wang, Beijing (CN); Liang Tian, Beijing (CN); Yu Feng, Beijing (CN); Bin Liu, Beijing (CN); Chenglong Wang, Beijing (CN); Yuxuan Ma, Beijing (CN)

(73) Assignees: Ordos Yuansheng G roni Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 208 days.

(21) Appl. No.: 17/771,720

(22) PCT Filed: Mar. 8, 2021

(86) PCT No.: PCT/CN2021/079610
§ 371 (c)(1),
(2) Date: Apr. 25, 2022

(87) PCT Pub. No.: WO2022/188011
PCT Pub. Date: Sep. 15, 2022

(65) Prior Publication Data
US 2023/0163200 A1  May 25, 2023

(51) Int. Cl.
*H01L 21/76* (2006.01)
*H01L 23/48* (2006.01)
(Continued)

(52) U.S. Cl.
CPC .... *H01L 29/6675* (2013.01); *H01L 29/78672* (2013.01); *H01L 29/78696* (2013.01)

(58) Field of Classification Search
CPC ............ H01L 29/516; H01L 29/40111; H01L 29/6684; H01L 29/78391; H01L 29/7843;
(Continued)

(56) References Cited

U.S. PATENT DOCUMENTS

2005/0139923 A1\* 6/2005 Kwon ................. H01L 29/6675
257/E29.05
2008/0044958 A1 2/2008 Hwang
(Continued)

FOREIGN PATENT DOCUMENTS

CN 101127328 A 2/2008
CN 105633095 A 6/2016
(Continued)

*Primary Examiner* — Sheikh Maruf
(74) *Attorney, Agent, or Firm* — IPro, PLLC

(57) ABSTRACT

A method for manufacturing a display substrate is provided. The method includes: forming a first active layer arranged in the NMOS transistor region and a second active layer arranged in the PMOS transistor region on the base substrate; coating one side, facing away from the base substrate, of the first active layer and one side, facing away from the base substrate, of the second active layer with a first photoresist layer, forming a first pattern layer by patterning the first photoresist layer to expose at least two ends of the first active layer; forming N-type heavily doped regions by performing N-type heavy doping on the two ends of the first active layer with the first pattern layer as a mask; forming a second pattern layer by processing the first pattern layer to expose at least a middle region of the first active layer.

18 Claims, 9 Drawing Sheets

(51) Int. Cl.
*H01L 29/66* (2006.01)
*H01L 29/786* (2006.01)

(58) Field of Classification Search
CPC .......... H01L 29/6675; H01L 29/78672; H01L 29/78696; H01L 27/0629; H01L 29/78675; H01L 29/66772
USPC ......................................... 257/295; 438/478
See application file for complete search history.

(56) References Cited

U.S. PATENT DOCUMENTS

| | | | | |
|---|---|---|---|---|
| 2009/0283763 | A1* | 11/2009 | Park | H01L 27/1225 257/E29.296 |
| 2011/0204364 | A1* | 8/2011 | Isa | H01L 29/04 257/E21.414 |
| 2012/0049283 | A1* | 3/2012 | Miyairi | H01L 29/78672 438/157 |
| 2014/0097502 | A1* | 4/2014 | Sun | H01L 29/772 977/762 |
| 2015/0325602 | A1* | 11/2015 | Im | H01L 27/1225 257/43 |
| 2016/0020228 | A1* | 1/2016 | Jiang | H01L 27/1288 257/43 |
| 2016/0027887 | A1* | 1/2016 | Yuan | H01L 27/1225 257/43 |
| 2016/0043228 | A1* | 2/2016 | Jiang | H01L 29/0684 257/43 |
| 2017/0103890 | A1* | 4/2017 | Xu | H01L 29/6675 |
| 2017/0184887 | A1* | 6/2017 | Xiao | G02F 1/1339 |
| 2017/0207246 | A1* | 7/2017 | Wu | H01L 21/0262 |
| 2017/0278884 | A1* | 9/2017 | Yang | H01L 29/66666 |
| 2018/0076240 | A1* | 3/2018 | Takechi | H01L 27/1251 |
| 2018/0108657 | A1* | 4/2018 | Qin | H01L 27/1225 |
| 2018/0175073 | A1* | 6/2018 | Wang | H01L 27/1262 |
| 2018/0197952 | A1* | 7/2018 | Liang | H01L 29/775 |
| 2018/0212062 | A1* | 7/2018 | Xie | H01L 21/445 |
| 2018/0341134 | A1* | 11/2018 | Xiao | H01L 29/458 |
| 2019/0123073 | A1 | 4/2019 | Di | |
| 2020/0006572 | A1* | 1/2020 | Sharma | H01L 29/78642 |
| 2020/0020732 | A1* | 1/2020 | Bu | H01L 27/14607 |
| 2020/0251501 | A1* | 8/2020 | Sun | H01L 29/6675 |
| 2021/0167221 | A1* | 6/2021 | Ohta | H01L 29/78618 |
| 2021/0408003 | A1* | 12/2021 | Lin | H01L 29/6675 |
| 2022/0231170 | A1* | 7/2022 | Fan | H01L 29/6675 |
| 2023/0207623 | A1* | 6/2023 | Guler | H01L 29/66439 257/14 |

FOREIGN PATENT DOCUMENTS

| | | |
|---|---|---|
| CN | 107768310 A | 3/2018 |
| CN | 110047800 A | 7/2019 |
| KR | 20060014671 A | 2/2006 |

* cited by examiner

METHOD FOR MANUFACTURING DISPLAY SUBSTRATE

CROSS-REFERENCE TO RELATED APPLICATION

This application is a national phase entry under 35 U.S.C. § 371 of International Application No. PCT/CN2021/079610, filed Mar. 8, 2021.

FIELD

The disclosure relates to the field of display, in particular to a method for manufacturing a display substrate.

BACKGROUND

With the continuous development of the display technology, such as liquid crystal display (LCD) display, organic light emitting diode (OLED) display, flexible display and the like, the display panel is widely applied to all walks of life. However, the high production cost of the display panel still becomes a factor hindering the further development of the display panel.

A display panel generally includes a display substrate, and the manufacturing process of the display substrate is most complex. Generally speaking, the display substrate includes a thin film transistor (TFT), and the TFT includes a gate, a gate insulating layer, an active layer, a source, a drain and the like. When a thin film transistor is manufactured, a mask is usually used for exposure and development, and then a pattern needed by each layer is etched. In the related art, the quantity of masks needed for preparing the CMOS type display substrate is large, and the product manufacturing period is long.

SUMMARY

The embodiments of the disclosure provide a method for manufacturing a display substrate.

The method includes the following steps: providing a base substrate, and the base substrate includes a Negative channel Metal Oxide Semiconductor (NMOS) transistor region and a Positive channel Metal Oxide Semiconductor (PMOS) transistor region;
  forming a first active layer arranged in the NMOS transistor region and a second active layer arranged in the PMOS transistor region on the base substrate;
  coating one side, facing away from the base substrate, of the first active layer and one side, facing away from the base substrate, of the second active layer with a first photoresist layer;
  forming a first pattern layer by patterning the first photoresist layer to expose at least two ends of the first active layer;
  forming N-type heavily doped regions by performing N-type heavy doping on the two ends of the first active layer with the first pattern layer as a mask;
  forming a second pattern layer by processing the first pattern layer to expose at least a middle region of the first active layer;
  performing channel doping on the first active layer by taking the second pattern layer as a mask;
  after stripping the second pattern layer, forming P-type heavily doped regions by performing P-type heavy doping on two ends of the second active layer;
  forming a first source and a first drain on one side, facing away from the base substrate, of the first active layer, and the first source and the first drain are electrically connected with the N-type heavily doped regions;
  forming a second source and a second drain on one side, facing away from the base substrate, of the second active layer, and the second source and the second drain are electrically connected with the P-type heavily doped regions.

Optionally, in the method for manufacturing the display substrate provided by the embodiments of the disclosure, the forming the first pattern layer by patterning the first photoresist layer to expose at least the two ends of the first active layer further includes:
  forming the first pattern layer by exposing and developing the first photoresist layer;
  the first pattern layer includes a first photoresist layer complete removal region corresponding to the two ends of the first active layer, a first photoresist layer partial reservation region corresponding to the middle region of the first active layer, and a first photoresist layer complete reservation region corresponding to the second active layer.

Optionally, in the method for manufacturing the display substrate provided by the embodiments of the disclosure, the forming the second pattern layer by processing the first pattern layer to expose at least the middle region of the first active layer further includes:
  ashing the first pattern layer by adopting a dry etching process to remove the first photoresist layer corresponding to the middle region of the first active layer; and
  forming the second pattern layer by thinning a thickness of the first photoresist layer corresponding to the second active layer.

Optionally, in the method for manufacturing the display substrate provided by the embodiments of the disclosure, the forming the P-type heavily doped regions by performing P-type heavy doping on the two ends of the second active layer, after stripping the second pattern layer further includes:
  depositing a gate insulating layer on the one side, facing away from the base substrate, of the first active layer and the one side, facing away from the base substrate, of the second active layer, depositing a first metal layer on one side, facing away from the base substrate, of the gate insulating layer, forming, by patterning the first metal layer, a first gate located on the one side, facing away from the base substrate, of the first active layer, and a second gate located on one side, facing away from the base substrate, of the second active layer;
  coating a second photoresist layer on one side, facing away from the base substrate, of the first gate and one side, facing away from the base substrate, of the second gate, and forming a second photoresist layer complete reservation region corresponding to the first active layer and a second photoresist layer complete removal region corresponding to the second active layer on the second photoresist layer by exposing and developing the second photoresist layer;
  forming two P-type heavily doped regions by performing P-type heavy doping on two ends of the second active layer with the second gate electrode as a mask; and a region between the two P-type heavily doped regions in the second active layer forms a second channel region; and
  stripping the residual second photoresist layer.

Optionally, in the method for manufacturing the display substrate provided by the embodiments of the disclosure, the patterning the first metal layer further includes: coating a third photoresist layer on one side, facing away from the base substrate, of the first metal layer, and forming a third pattern layer by exposing and developing the third photoresist layer;

the third pattern layer includes a third photoresist layer complete reservation region corresponding to the first gate and the second gate and a second photoresist layer complete removal region corresponding to the N-type heavily doped regions and inner sides of the N-type heavily doped regions;

before the forming the first gate on the one side, facing away from the base substrate, of the first active layer, and the second gate located on the one side, facing away from the base substrate, of the second active layer, the method further includes;

forming two N-type lightly doped regions by performing N-type light doping on the first active layer with the third pattern layer as a mask, and the two N-type lightly doped regions are respectively positioned on the inner sides of the two N-type heavily doped regions;

a region positioned between the two N-type lightly doped regions in the first active layer forms a first channel region;

the forming the first gate arranged on the one side, facing away from the base substrate, of the first active layer, and the second gate arranged on the one side, facing away from the base substrate, of the second active layer further includes:

forming the first gate and the second gate by etching the first metal layer with the third pattern layer as a mask.

Optionally, in the method for manufacturing the display substrate provided by the embodiments of the disclosure, the forming the first source and the first drain on the one side, facing away from the base substrate, of the first active layer, the first source and the first drain are electrically connected with the N-type heavily doped regions; and forming the second source and the second drain on the one side, facing away from the base substrate, of the second active layer, the second source and the second drain are electrically connected with the P-type heavily doped regions further includes:

depositing an interlayer insulating layer on one side, facing away from the base substrate, of the first gate and on one side, facing away from the base substrate, of the second gate electrode, and forming first via holes arranged above the N-type heavily doped regions and second via holes arranged above the P-type heavily doped regions by patterning the interlayer insulating layer and the gate insulating layer; and depositing a second metal layer on one side, facing away from the base substrate, of the interlayer insulating layer, forming a first source, a first drain, a second source and a second drain by patterning the second metal layer, the first source and the first drain are electrically connected with the N-type heavily doped regions through the first via holes respectively, and the second source and the second drain are electrically connected with the P-type heavily doped regions through the second via holes respectively.

Optionally, in the method for manufacturing the display substrate provided by the embodiments of the disclosure, before the coating the one side, facing away from the base substrate, of the first active layer and one side, facing away from the base substrate, of the second active layer with the first photoresist layer, the method further includes:

performing threshold voltage doping on the first active layer and the second active layer.

Optionally, in the method for manufacturing the display substrate provided by the embodiments of the disclosure, the base substrate is further includes a PIN region; and the method further includes:

forming a semiconductor layer arranged in the PIN region on the base substrate while forming the first active layer arranged in the NMOS transistor region and a second active layer arranged in the PMOS transistor region on the base substrate; and performing threshold voltage doping on the semiconductor layer while performing threshold voltage doping on the first active layer and the second active layer.

Optionally, in the method for manufacturing the display substrate provided by the embodiments of the disclosure, while forming the first pattern layer by patterning the first photoresist layer, the method further includes: exposing one end of the semiconductor layer; and forming a first N-type heavily doped region by performing N-type heavy doping on the one end of the semiconductor layer, while forming two N-type heavily doped regions by performing N-type heavy doping on two ends of the first active layer to with the first pattern layer as a mask.

Optionally, in the method for manufacturing the display substrate provided by the embodiments of the disclosure, forming the second pattern layer by processing the first pattern layer, the method further includes: exposing the remaining part of the semiconductor layer; and performing channel doping on the semiconductor layer while performing channel doping on the first active layer by taking the second pattern layer as a mask.

Optionally, in the method for manufacturing the display substrate provided by the embodiments of the disclosure, while performing N-type light doping on the first active layer, forming a first N-type lightly doped region by performing the N-type light doping on the semiconductor layer with the third pattern layer as a mask; and the N-type lightly doped region is arranged on inner sides of the first N-type heavily doped region.

Optionally, in the method for manufacturing the display substrate provided by the embodiments of the disclosure, while forming the first gate and the second gate, the method further includes: forming a first electrode arranged on one side, facing away from the base substrate, of the semiconductor layer.

Optionally, in the method for manufacturing the display substrate provided by the embodiments of the disclosure, while exposing and developing the second photoresist layer, the method further includes:

forming a second photoresist layer complete reservation region corresponding to the first N-type lightly doped region and the first N-type heavily doped region on the second photoresist layer, and a second photoresist layer complete removal region corresponding to other regions of the semiconductor layer; and while performing P-type heavy doping on the two ends of the second active layer, forming a first P-type heavily doped region by performing P-type heavy doping on an another one end of the semiconductor layer;

a region between the first N-type lightly doped region and the first P-type heavily doped region in the semiconductor layer form an intrinsic region.

Optionally, in the method for manufacturing the display substrate provided by the embodiments of the disclosure, while forming the first via holes and the second via holes by patterning the interlayer insulating layer and the gate insulating layer, the method further includes: forming a third via hole arranged above the first P-type heavily doped region, and a fourth via hole arranged above the first N-type heavily doped region; and while forming the first source, the first drain, the second source and the second drain by patterning the second metal layer, the method further includes: forming a second electrode and a third electrode, wherein the second electrode is electrically connected with the first P-type heavily doped region through the third via hole, and the third electrode is electrically connected with the first N-type heavily doped region through the fourth via hole.

Optionally, in the method for manufacturing the display substrate provided by the embodiments of the disclosure, the first active layer and the second active layer are polycrystalline silicon layers, and the forming the first active layer located in the NMOS transistor region and the second active layer located in the PMOS transistor region on the base substrate further includes:

depositing an amorphous silicon layer on the base substrate, and converting the amorphous silicon layer into a polycrystalline silicon layer by adopting a low-temperature crystallization process; and forming the first active layer arranged in the NMOS transistor region and the second active layer arranged in the PMOS transistor region by patterning the polycrystalline silicon layer.

DETAILED DESCRIPTION OF THE EMBODIMENTS

In order to enable the objective, the technical solution and the advantages of the disclosure to be clearer, the specific implementation mode of the method for manufacturing the display substrate provided by the embodiment of the disclosure is described in detail according to the following drawings. It should be understood that the preferred embodiment described below is only used to illustrate and interpret the disclosure, but not to define the disclosure. Under the condition of no conflict, the embodiments in the application and the features in the embodiments can be combined with each other.

The thickness, the size and the shape of each layer of film in the attached drawing do not reflect the real proportion of the display substrate, and the purpose is only to illustrate the content of the disclosure.

The thin film transistor technology can include a polycrystalline silicon (Poly-Si) technology and an amorphous silicon (a-Si) technology, and the difference between the polycrystalline silicon (Poly-Si) technology and the amorphous silicon (a-Si) technology lies in different transistor characteristics. Compared with the traditional a-Si technology, although the low temperature poly-silicon (LTPS) technology is complex in process, the low temperature poly-silicon (LTPS) technology has higher carrier mobility, so that the low temperature poly-silicon (LTPS) technology is widely applied to the manufacturing of TFTLCD and AMOLED panels with medium and small sizes and high resolution. According to the manufacturing mode of the LTPS, the LTPS is mainly divided into an N-type metal oxide semiconductor (NMOS), a P-type metal oxide semiconductor (PMOS) and a complementary metal oxide semiconductor (CMOS), and the NMOS transistor and the PMOS transistor jointly form a CMOS transistor.

Compared with NMOS and PMOS driving circuits, a CMOS driving circuit is more stable and has a larger process window, however, due to the difference in design and working principles of the PMOS and the NMOS, an existing CMOS product needs to be formed through a multi-doping process in the manufacturing process of the display substrate, and the multi-doping process includes channel doping, threshold voltage doping (Vth Doping), N-type heavy doping (N+ Doping), a lightly doped drain structure (LDD Doping) and P-type heavy doping (P+ Doping), the process flow is complicated, the time using for manufacturing the required process is longer, and the cost is higher.

In the manufacturing process of an existing CMOS transistor, Channel Doping and N+Doping respectively adopt a mask manufacturing process for doping, so that the number of masks required on the whole is large, and the manufacturing period of a product is long.

Figure 1:
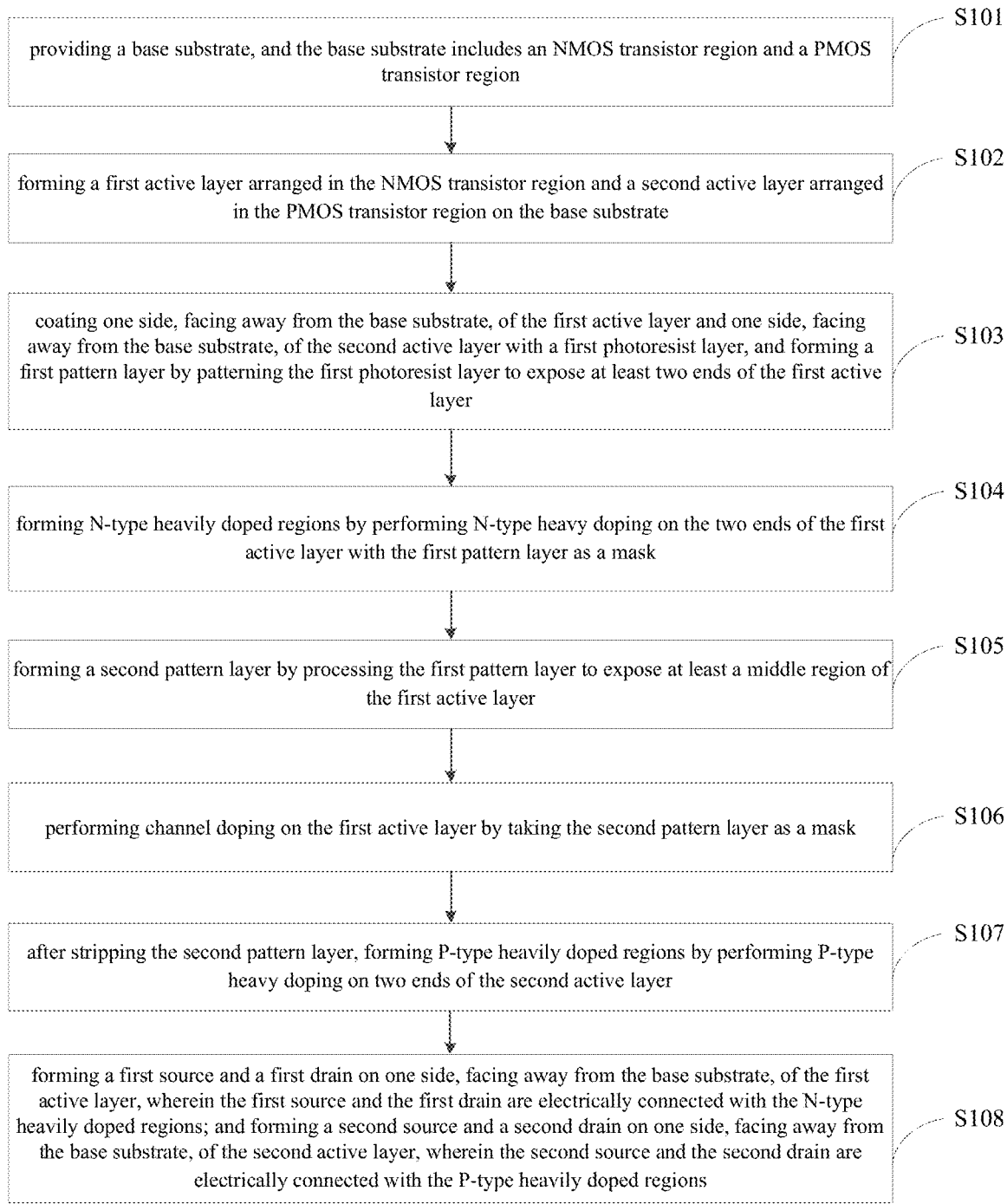
FIG. 1 is a flow chart of the method for manufacturing the display substrate provided by the embodiment of the disclosure.

The embodiment of the disclosure provides a method manufacturing for a display substrate, as shown in FIG. 1, including:

S101, providing a base substrate, and the base substrate includes a Negative channel Metal Oxide Semiconductor (NMOS) transistor region and a Positive channel Metal Oxide Semiconductor (PMOS) transistor region;

S102, forming a first active layer arranged in the NMOS transistor region and a second active layer arranged in the PMOS transistor region on the base substrate;

S103, coating one side, facing away from the base substrate, of the first active layer and one side, facing away from the base substrate, of the second active layer with a first photoresist layer, and forming a first pattern layer by patterning the first photoresist layer to expose at least two ends of the first active layer;

S104, forming N-type heavily doped regions by performing N-type heavy doping on the two ends of the first active layer with the first pattern layer as a mask;

S105, forming a second pattern layer by processing the first pattern layer to expose at least a middle region of the first active layer;

S106, performing channel doping on the first active layer by taking the second pattern layer as a mask;

S107, after stripping the second pattern layer, forming P-type heavily doped regions by performing P-type heavy doping on two ends of the second active layer; and S108, forming a first source and a first drain on one side, facing away from the base substrate, of the first active layer, wherein the first source and the first drain are electrically connected with the N-type heavily doped regions; and forming a second source and a second drain on one side, facing away from the base substrate, of the second active layer, wherein the second source and the second drain are electrically connected with the P-type heavily doped regions.

According to the method for manufacturing the display substrate provided by the embodiments of the disclosure, the two doping procedures of N-type heavy doping and channel doping of the first active layer can be realized by adopting one photomask, however, the N-type heavy doping and channel doping of the first active layer need to be respectively performed by adopting photomasks in the related art; therefore, in the embodiments of the disclosure, the number of photomasks in the manufacturing process is reduced, the manufacturing process is simplified, the manufacturing period is shortened, the manufacturing cost is reduced, and the manufacturing capacity of the display substrate is improved.

The method for manufacturing the array substrate provided by the embodiments of the disclosure is described in detail in combination with the attached drawings.

Figure 2:
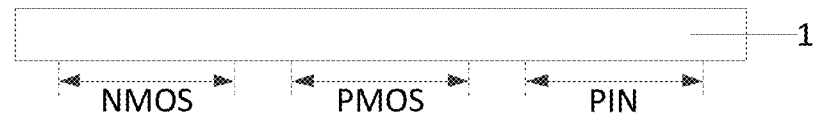
FIG. 2-FIG. 22 are structural schematic diagrams for steps executed by the method for manufacturing the display substrate provided by the embodiment of the disclosure respectively.

As shown in FIG. 2, a base substrate 1 is provided, and the base substrate 1 includes an NMOS transistor region and a PMOS transistor region; and the base substrate 1 can be a glass substrate, a quartz substrate or a plastic substrate and the like.

Figure 3:
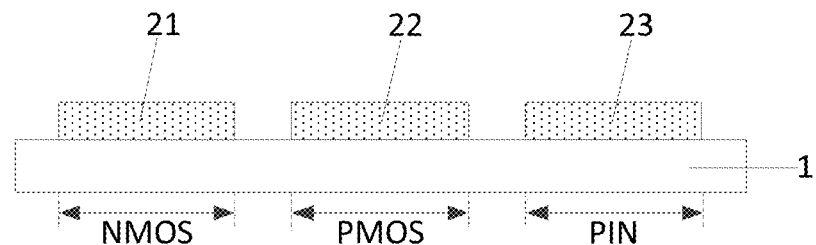

As shown in FIG. 3, forming a first active layer 21 arranged in the NMOS transistor region and a second active layer 22 arranged in the PMOS transistor region on the base substrate1; the first active layer 21 and the second active layer 22 are polycrystalline silicon layers, and the formation of the first active layer 21 and the second active layer 22 can be as follows: an amorphous silicon (a-Si) layer is deposited on the base substrate 1 through a chemical vapor deposition method, the amorphous silicon layer is converted into the polycrystalline silicon layer through a low-temperature crystallization process, and the low-temperature crystallization process can be Excimer Laser Annealing (ELA); then the polycrystalline silicon layer is patterned to form the first active layer 21 arranged in the NMOS transistor region and the second active layer 22 arranged in the PMOS transistor region.

Figure 4:
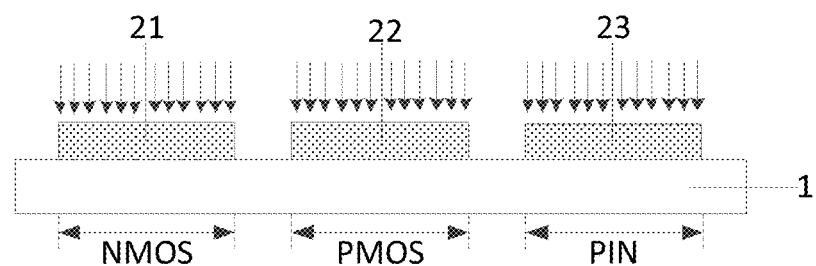

As shown in FIG. 4, threshold voltage doping (Vth Doping) is performed on the first active layer (21) and the second active layer (22). Through Vth Doping, better ohmic contact and low series resistance can be provided for an NMOS transistor and a PMOS transistor. Accordingly, ions of the threshold voltage doping can be boron ions and the like, and the doping concentration is selected according to actual needs, which is not specifically limited in the present disclosure.

Figure 5:
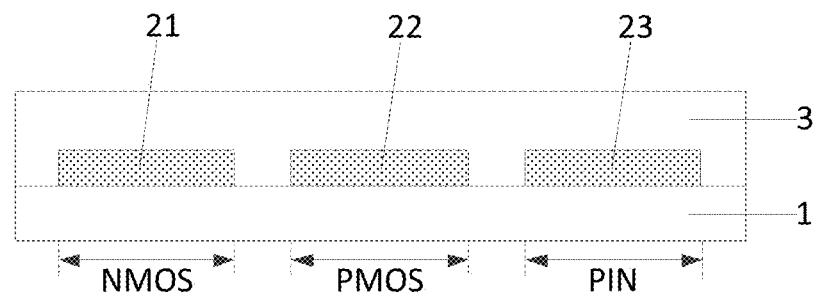

As shown in FIG. 5, one side, facing away from the base substrate 1, of the first active layer 21 and one side, facing away from the base substrate 1, of the second active layer 22 are coated with a first photoresist layer 3. For example, the photoresist can be positive photoresist, and in the embodiments of the disclosure, the photoresist is described as the positive photoresist. Certainly, the photoresist can also be negative photoresist, and those skilled in the field can adopt the negative photoresist to realize the embodiments of the disclosure on the premise of not making creative labor.

Figure 6:
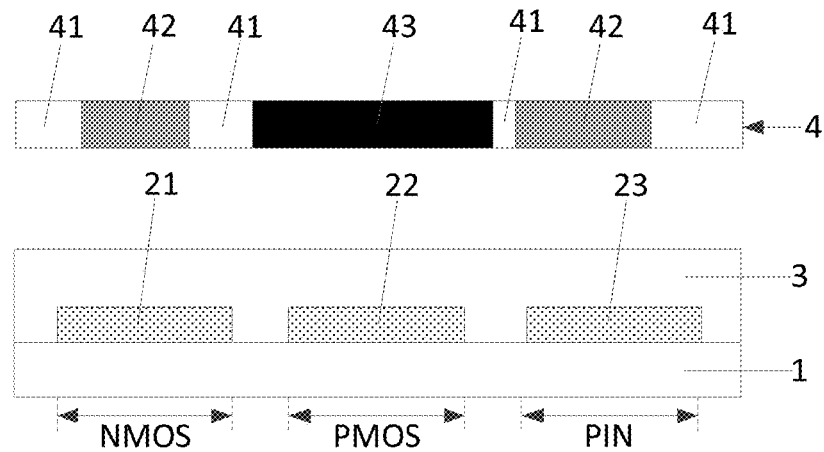
Figure 7:
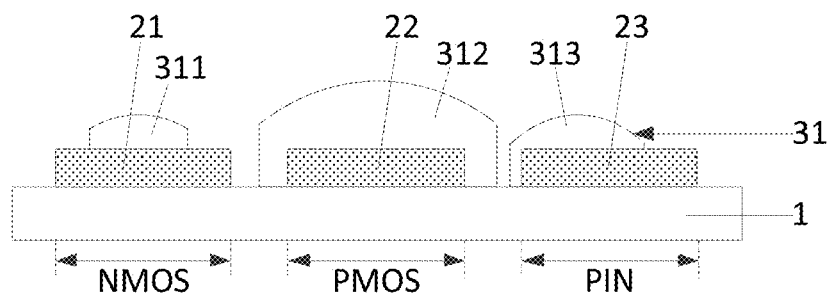

Then, a first pattern layer is formed by patterning the first photoresist layer 3 to expose at least the two ends of the first active layer. As shown in FIG. 6, the first photoresist layer 3 can be exposed through a halftone mask 4, a full-exposure region 41 of the halftone mask 4 corresponds to regions at the two ends of the first active layer 21, and a half-exposure region 42 of the halftone mask 4 corresponds to a middle region of the first active layer 21, and a non-exposure region 43 of the halftone mask 4 corresponds to the second active layer 22; as shown in FIG. 7, forming a first pattern layer 31 by developing the first photoresist layer 3 after exposure; the first pattern layer 31 includes a first photoresist layer complete removal region corresponding to the two ends of the first active layer 21, a first photoresist layer partial reservation region 311 corresponding to the middle region of the first active layer 21 and a first photoresist layer complete reservation region 312 corresponding to the second active layer 22. Of course, due to the process error, a certain error exists between the thickness of the photoresist in the partial reservation region 311 and the thickness of the photoresist in the complete reservation region 312 during developing.

Figure 8:
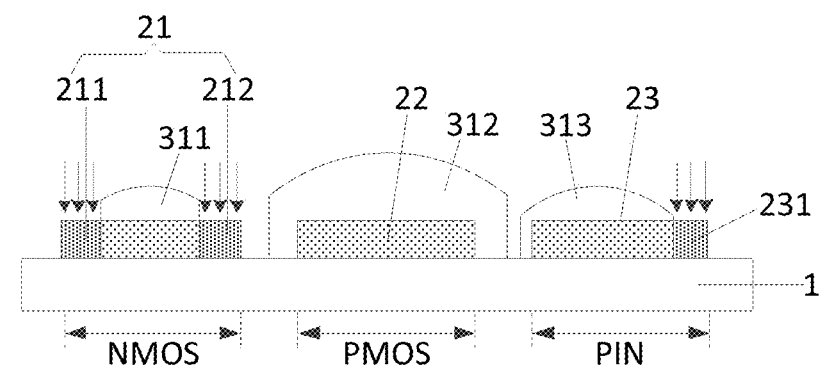

As shown in FIG. 8, N-type heavily doped regions (211 and 212) is formed by performing N-type heavy doping (as shown by arrows) on two ends of the first active layer 21 with the first pattern layer 31 as a mask; the N-type heavily doped regions (211 and 212) are formed to be electrically connected with the source and the drain of the NMOS transistor respectively, a large number of free electrons can be provided for conduction of the NMOS transistor through doping of N-type ions (such as phosphorus ions) with high-concentration, and the N-type heavily doped regions (211 and 212) are small in resistance and can be equivalent to conductors.

Figure 9:
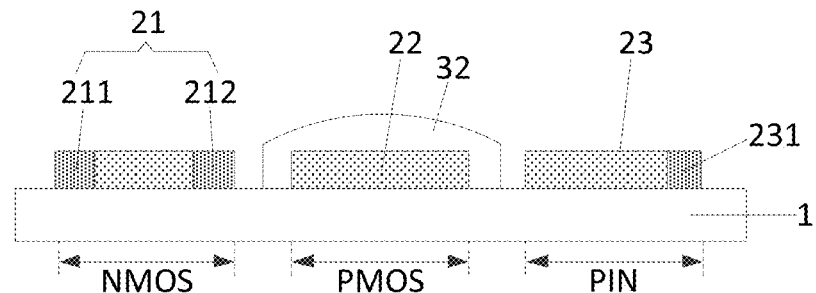

Then, a second pattern layer is formed by processed the first pattern layer to expose at least the middle region of the first active layer, accordingly, as shown in FIG. 9, ashing the first pattern layer 31 in FIG. 8 through the dry etching process, so that a first photoresist layer (namely 311 in FIG. 8) corresponding to the middle region of the first active layer 21 is removed, and a second pattern layer 32 is formed by thinning the thickness of the first photoresist layer corresponding to the second active layer 22 (from 312 in FIGS. 8 to 32 in FIG. 9).

Figure 10:
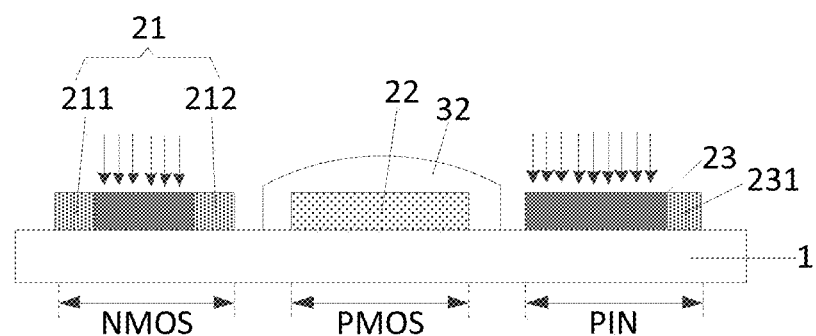

As shown in FIG. 10, the second pattern layer 32 is used as a mask, performing channel doping on the first active layer 21 (as shown by arrows, namely, channel doping is performed on the middle region of the first active layer); through channel doping, the threshold voltage of the NMOS transistor can be adjusted. Specifically, ions for channel doping can be boron ions and the like, the doping concentration is selected according to actual needs, which is not specifically limited in the present disclosure. It should be noted that the concentration of ions doped in the N-type heavily doped region is far greater than the concentration of ions for channel doping, so that channel doping does not affect the N-type heavily doped region.

Figure 11:
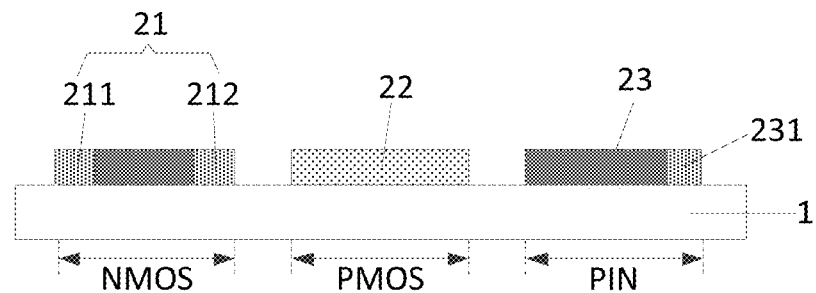

As shown in FIG. 11, the second pattern layer 32 is stripped by adopting a photoresist stripping process.

Figure 12:
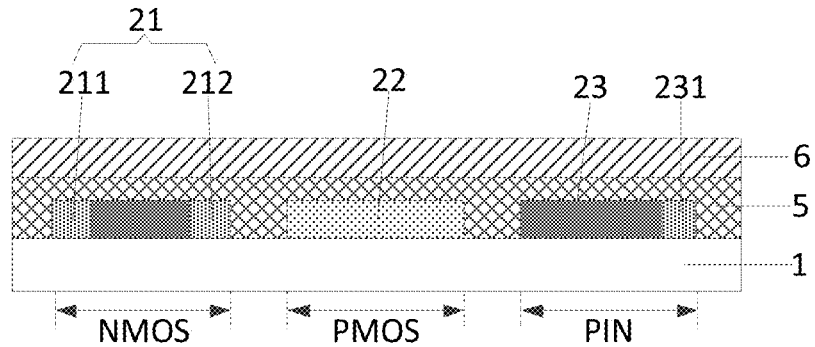

Next, P-type heavily doped regions is formed by performing P-type heavy doping on the two ends of the second active layer, accordingly, as shown in FIG. 12, a gate insulating layer 5 is deposited on the one side, facing away from the base substrate 1, of the first active layer 21 and the one side, facing away from the base substrate 1, of the second active layer 22, and a first metal layer 6 is deposited on the side, facing away from the base substrate 1, of the gate insulating layer 5.

Figure 13:
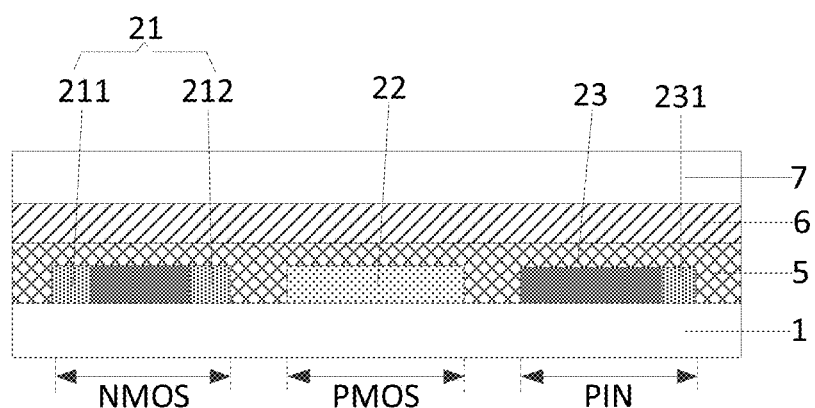
Figure 14:
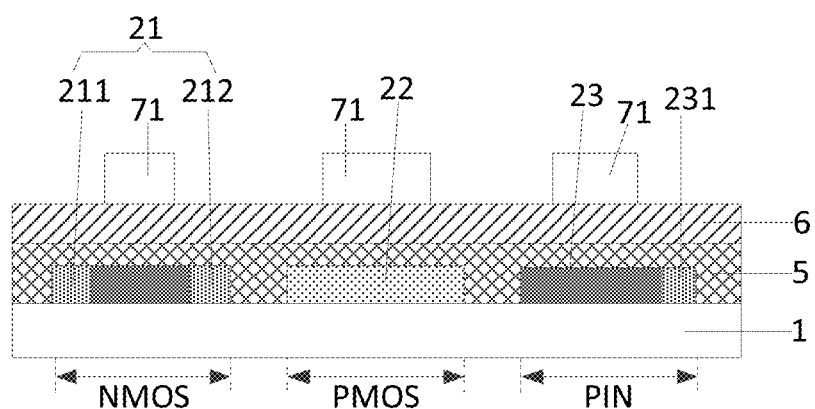

Then, the first metal layer 6 is patterned as shown in FIG. 13, which includes the steps that the side, facing away from the base substrate 1, of the first metal layer 6 is coated with a third photoresist layer 7; as shown in FIG. 14, a third pattern layer is formed by exposing and developing the third photoresist layer 7, and the third pattern layer includes a third photoresist layer complete reservation region 71 corresponding to a first gate 61 (subsequently formed) and a second gate 62 (subsequently formed) and a second photoresist layer complete removal region corresponding to the N-type heavily doped regions (211 and 212) and the inner sides of the N-type heavily doped regions.

Figure 15:
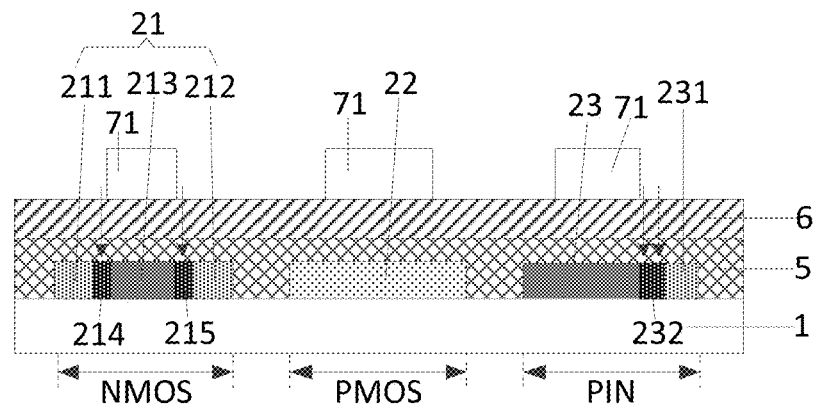

As shown in FIG. 15, two N-type lightly doped regions (214 and 215) is formed by performing N-type light doping (LDD Doping) (as shown by arrows) on the first active layer 21 with a third pattern layer (a complete reservation region 71) as a mask, the two N-type lightly doped regions (214 and 215) are respectively positioned on the inner sides of the two N-type heavily doped regions (211 and 212), and a region positioned between the two N-type lightly doped regions (214 and 215) in the first active layer 21 forms a first channel region 213. In LDD Doping, the hot carrier effect can be improved through low-concentration doping, specifically, two N-type lightly-doped regions (214 and 215) are injected with ions of a low dosage (compared with N-type heavy doping), the ion dosage injected in two N-type lightly-doped regions (214 and 215) is between a doping amount of the N-type heavily-doped regions and a doping amount of a region below a first gate 61, and therefore a buffer region with a certain concentration is formed, and the edge electric field gradient and the hot carrier effect of the drain end are reduced, and the leakage current of the NMOS transistor is reduced. It should be noted that the concentration of ions doped in the N-type heavily doped region is far greater than the concentration of ions doped in the N-type lightly doped region, so that the N-type heavily doped region is not affected by N-type light doping.

Figure 16:
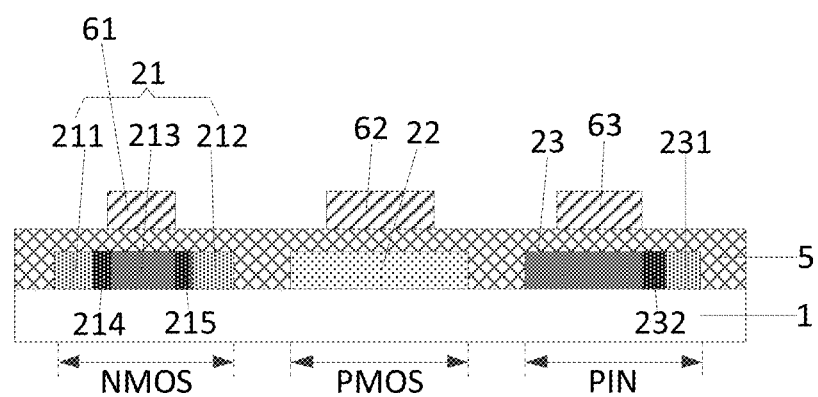

As shown in FIG. 16, a first gate 61 arranged on one side, facing away from the base substrate1, of the first active layer 21 and a second gate 62 arranged on one side, facing away from the base substrate 1, of the second active layer 22 are formed by etching the first metal layer with a third pattern layer (a complete reservation region 71) as a mask.

Figure 17:
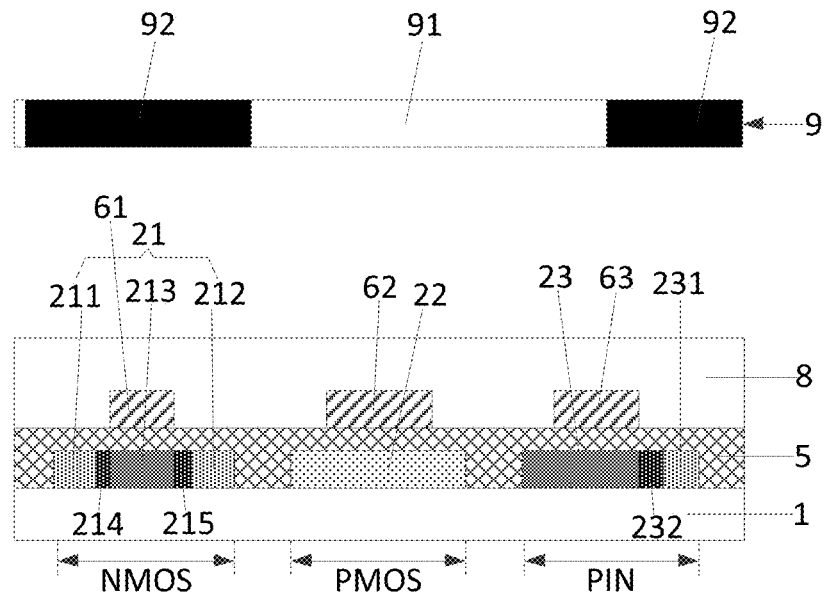
Figure 18:
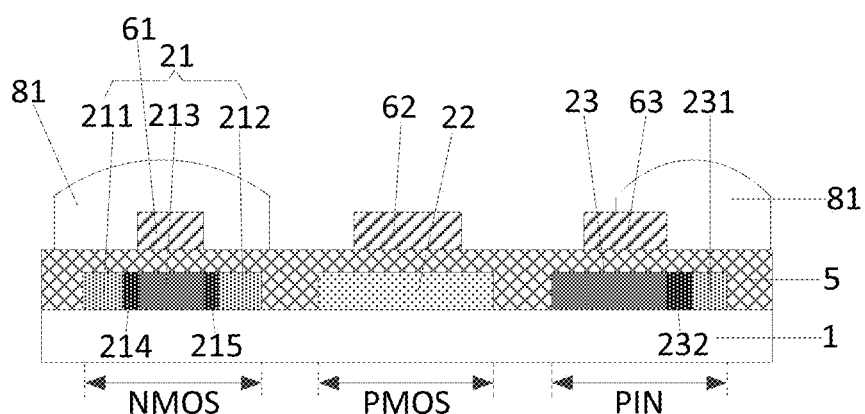

As shown in FIG. 17, one side, facing away from the base substrate 1, of the first gate 61 and one side, facing away from the base substrate 1, of the second gate 62 are coated with a second photoresist layer 8, the second photoresist layer 8 can be exposed through a halftone mask 9, the full-exposure region 91 of the halftone mask 9 corresponds to the second active layer 22, and the non-exposure region 92 of the halftone mask 9 corresponds to the first active layer 21; as shown in FIG. 18, the second photoresist layer 8 after exposure is developed, a second photoresist layer complete reservation region 81 corresponding to the first active layer 21 and a second photoresist layer complete removal region corresponding to the second active layer 22 are formed on the second photoresist layer 8, and certainly, the thickness of photoresist in the complete reservation region 81 during development has a certain error due to the process error.

Figure 19:
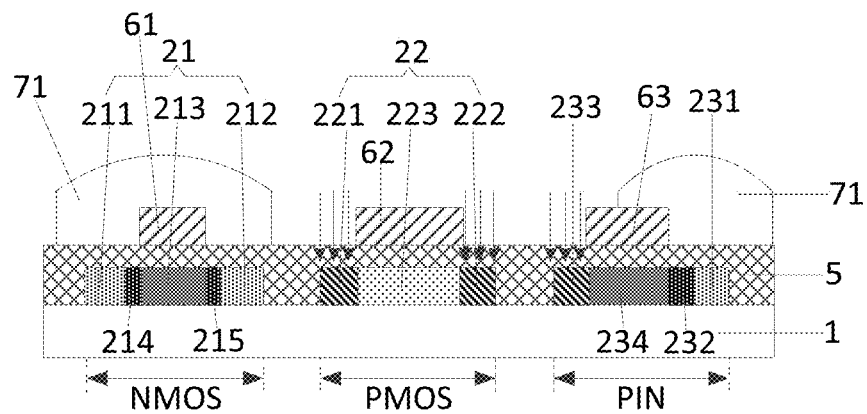

As shown in FIG. 19, two P-type heavily doped regions (221 and 222) are formed by performing P-type heavy doping (as shown by arrows) on two ends of the second active layer 22 with a second gate 62 as a mask to form, and a region between the two P-type heavily doped regions (221 and 222) in the second active layer 22 forms a second channel region 223; the P-type heavily doped regions (221 and 222) are formed to be electrically connected with the source and the drain of the PMOS transistor respectively, a large number of holes can be provided for conduction of the PMOS transistor through high-concentration P-type ion (such as boron ion) doping, and the P-type heavily doped regions (221 and 222) are small in resistance and can be equivalent to conductors.

Figure 20:
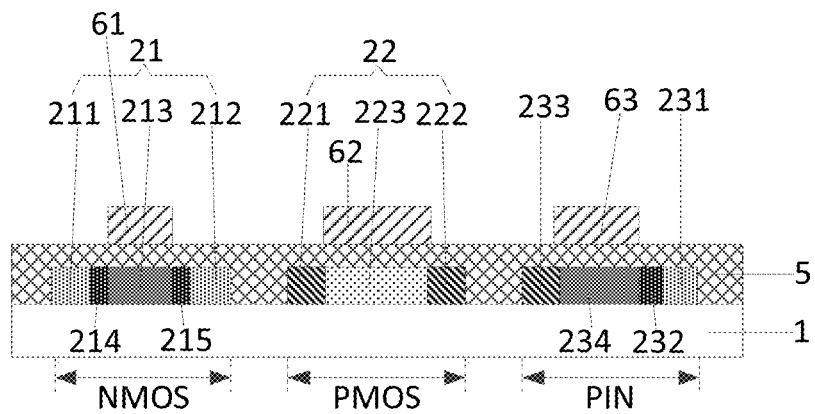

As shown in FIG. 20, the remaining second photoresist layer is stripped by adopting a photoresist stripping process (namely, the second photoresist arranged in a complete reservation region 81 is stripped).

Figure 21:
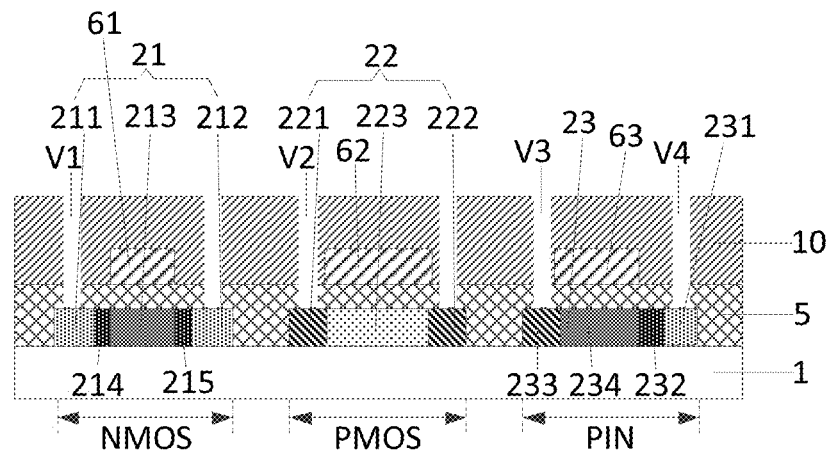

Then, the first source and the first drain which are electrically connected with the two N-type heavily doped regions are formed on one side, facing away from the base substrate, of the first active layer and the second source and the second drain which are electrically connected with the two P-type heavily doped regions are formed on one side, facing away from the base substrate, of the second active layer, as shown in FIG. 21, which includes: an interlayer insulating layer 10 is deposited on one side, facing away from the base substrate 1, of the first gate 61 and on one side, facing away from the base substrate 1, of the second gate 62, and first via holes V1 arranged above the N-type heavily doped regions (211 and 212) and second via holes V2 arranged above the P-type heavily doped regions (221 and 222) are formed by patterning (exposure, development and etching) the interlayer insulating layer 10 and the gate insulating layer 5.

Figure 22:
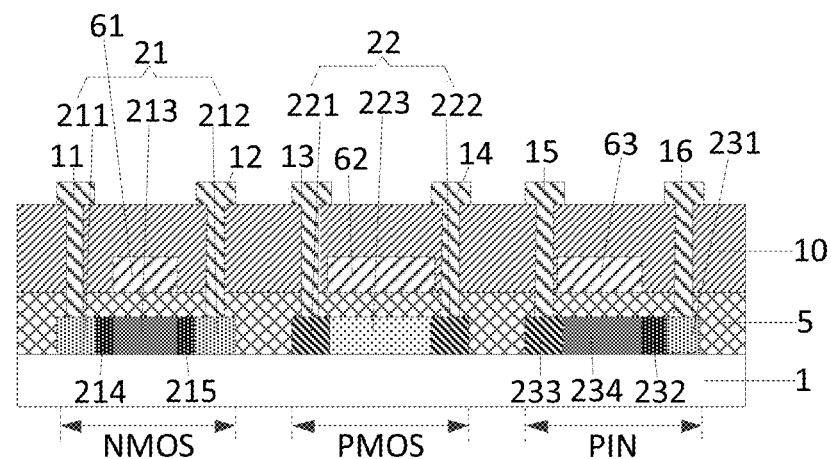

As shown in FIG. 22, a second metal layer is deposited on the side, facing away from the base substrate 1, of the interlayer insulating layer 10, a first source 11, a first drain 12, a second source 13 and a second drain 14 are formed by patterning the second metal layer, the first source 11 and the first drain 12 are electrically connected with the N-type heavily doped regions (211 and 212) through the first via holes V1 respectively, and the second source 13 and the second drain 14 are electrically connected with the P-type heavily doped regions (221 and 222) through the second via holes V2 respectively.

In some embodiments, the doping provided by the embodiments of the disclosure can be performed by adopting a diffusion or ion implantation mode.

In conclusion, according to the method for manufacturing the display substrate provided by the embodiments of the disclosure, the two doping procedures of N-type heavy doping and channel doping of the first active layer can be realized by adopting one photomask, while the N-type heavy doping and channel doping of the first active layer need to be respectively performed by adopting two photomasks in the related art; therefore, the number of photomasks in the manufacturing process is reduced, the manufacturing process is simplified, the manufacturing period is shortened, the manufacturing cost is reduced, and the manufacturing capacity of the display substrate is improved.

With continuous development of science and technology, the fingerprint identification technology has been gradually applied to the daily life of people. According to the fingerprint identification technology, identification can be performed by comparing detail feature points of different fingerprints, so that an identity recognition function is achieved. Generally, the fingerprint identification technology can be divided into an optical fingerprint identification technology, a silicon chip type fingerprint identification technology and an ultrasonic fingerprint identification technology. Due to the fact that the ultrasonic fingerprint identification technology has high safety and a better experience effect and also has a certain biological recognition function, it is more and more favored by the market and end consumers.

However, a display device using the ultrasonic fingerprint identification technology is provided with a positive-intrinsic negative (PIN) diode, and the PIN diode can be formed while the NMOS transistor and the PMOS transistor are formed, which is as follows.

As shown in FIG. 2, the base substrate 1 further includes a PIN region.

As shown in FIG. 3, while forming the first active layer 21 arranged in the NMOS transistor region and the second active layer 22 arranged in the PMOS transistor region on the base substrate 1, forming a semiconductor layer 23 located in the PIN region on the base substrate 1.

As shown in FIG. 4, performing threshold voltage doping on the first active layer 21 and the second active layer 22 while performing threshold voltage doping on the semiconductor layer 23.

As shown in FIG. 6 and FIG. 7, when forming the first pattern layer 31 by patterning the first photoresist layer 3, exposing one end of the semiconductor layer 23.

As shown in FIG. 8, when two N-type heavily doped regions (211 and 212) is formed by performing N-type heavy doping (as shown by arrows) on two ends of the first active layer 21 with the first pattern layer 31 as a mask, forming a first N-type heavily doped region 231 by performing N-type heavy doping (as shown by arrows) on one end of the semiconductor layer 23.

As shown in FIG. 9, when the second pattern layer 32 is formed by processing the first pattern layer 31, the remaining part of the semiconductor layer 23 is exposed.

As shown in FIG. 10, channel doping is performed on the semiconductor layer 23 while channel doping is performed on the first active layer 21 with the second pattern layer 32 as a mask (as shown by arrows).

As shown in FIG. 14, the third pattern layer further includes a third photoresist layer complete reservation region 71 corresponding to the middle region of the semiconductor layer 23.

As shown in FIG. 15, N-type light doping (LDD Doping) is performed on the first active layer 21, meanwhile, a first N-type lightly doped region 232 arranged on the inner side of the first N-type heavily doped region 231 is formed by performing N-type light doping (as shown by arrows) on the semiconductor layer 23 with the third pattern layer (complete reservation region 71) as a mask.

As shown in FIG. 16, when a first gate 61 and a second gate 62 are formed, a first electrode 63 located on the side, facing away from the base substrate 1, of a semiconductor layer 23 is formed.

As shown in FIG. 17, when exposing the second photoresist layer 8, a non-exposure region 92 of a halftone mask 9 corresponds to the first N-type lightly doped region 232 and the first N-type heavily doped region 231, and an exposure region 91 of the halftone mask 9 corresponds to other regions of the semiconductor layer 23; as shown in FIG. 18, the second photoresist layer 8 after exposure is developed, and a second photoresist layer complete reservation region corresponding to the first N-type lightly doped region 232 and the first N-type heavily doped region 231 and a second photoresist layer complete removal region corresponding to other regions of the semiconductor layer 23 are formed on the second photoresist layer 8.

As shown in FIG. 19, while P-type heavy doping is performed on the two ends of the second active layer 22 (as shown by arrows), a first P-type heavily doped region 233 is formed by performing P-type heavy doping on the another one end of the semiconductor layer 23, and a region 234, arranged between the first N-type lightly doped region 232 and the first P-type heavily doped region 233 in the semiconductor layer 23, forms an intrinsic region I.

As shown in FIG. 21, while forming the first via holes V1 and the second via holes V2 by patterning the interlayer insulating layer 10 and the gate insulating layer 5, forming a third via hole V3 arranged above the first P-type heavily doped region 233 and a fourth via hole V4 arranged above the first N-type heavily doped region 231.

As shown in FIG. 22, when the first source 11, the first drain 12, the second source 13 and the second drain 14 are formed by patterning the second metal layer, a second electrode 15 and a third electrode 16 are also formed, the second electrode 15 is electrically connected with the first P-type heavily doped region 233 through the third via hole V3, and the third electrode 16 is electrically connected with the first N-type heavily doped region 231 through the fourth via hole V4.

Therefore, according to the embodiments of the disclosure, the PIN diode is formed while the NMOS transistor and the PMOS transistor are formed, so that the manufacturing process can be further simplified, the manufacturing period can be shortened, the manufacturing cost can be reduced, and the manufacturing capacity of the ultrasonic display substrate can be improved. Moreover, the PIN diode manufactured by the embodiments of the disclosure is of a horizontal structure, that is, each part of the PIN diode is in the same film layer, so that the influence of a P-type semiconductor on the light absorptivity of an I-type semiconductor can be effectively avoided, and the photoelectric efficiency and the recognition capability of the photoelectric detection structure can be improved.

It needs to be explained that in the exposure and development process of the photoresist layer provided by the embodiments of the disclosure, a certain exposure error can exist as long as the position where the photoresist layer needs to be reserved can be shielded and the photoresist at the position where the photoresist needs to be removed is removed.

According to the method for manufacturing the display substrate provided by the embodiments of the disclosure, the two doping processes of N-type heavy doping and channel doping of the first active layer can be realized by adopting one photomask, and the N-type heavy doping and channel doping of the first active layer need to be respectively performed by adopting two photomasks in the related art; therefore, the number of photomasks in the manufacturing process is reduced, the manufacturing process is simplified, the manufacturing period is shortened, the manufacturing cost is reduced, and the manufacturing capacity of the display substrate is improved.

Obviously, those skilled in the field can make various modifications and variations to the disclosure without departing from the spirit and scope of the disclosure. In this way, if these modifications and variants of the present disclosure belong to the scope of the claims of the present disclosure and their equivalent techniques, the disclosure is also intended to include these modifications and variants.

What is claimed is:

1. A method for manufacturing a display substrate, comprising:
providing a base substrate, wherein the base substrate comprises a Negative channel Metal Oxide Semiconductor (NMOS) transistor region and a Positive channel Metal Oxide Semiconductor (PMOS) transistor region;
forming a first active layer arranged in the NMOS transistor region and a second active layer arranged in the PMOS transistor region on the base substrate;
coating one side, facing away from the base substrate, of the first active layer and one side, facing away from the base substrate, of the second active layer with a first photoresist layer;

forming a first pattern layer by patterning the first photoresist layer to expose at least two ends of the first active layer;
forming N-type heavily doped regions by performing N-type heavy doping on the two ends of the first active layer with the first pattern layer as a mask;
forming a second pattern layer by processing the first pattern layer to expose at least a middle region of the first active layer;
performing channel doping on the first active layer by taking the second pattern layer as a mask;
forming P-type heavily doped regions by performing P-type heavy doping on two ends of the second active layer, after stripping the second pattern layer;
forming a first source and a first drain on one side, facing away from the base substrate, of the first active layer, wherein the first source and the first drain are electrically connected with the N-type heavily doped regions; and
forming a second source and a second drain on one side, facing away from the base substrate, of the second active layer, wherein the second source and the second drain are electrically connected with the P-type heavily doped regions;
wherein said forming the P-type heavily doped regions by performing P-type heavy doping on the two ends of the second active layer, after stripping the second pattern layer further comprises:
depositing a gate insulating layer on the one side, facing away from the base substrate, of the first active layer and the one side, facing away from the base substrate, of the second active layer;
depositing a first metal layer on one side, facing away from the base substrate, of the gate insulating layer;
forming, by patterning the first metal layer, a first gate arranged on the one side, facing away from the base substrate, of the first active layer and a second gate arranged on the one side, facing away from the base substrate, of the second active layer;
coating a second photoresist layer on one side, facing away from the base substrate, of the first gate and one side, facing away from the base substrate, of the second gate;
forming a second photoresist layer complete reservation region corresponding to the first active layer and a second photoresist layer complete removal region corresponding to the second active layer on the second photoresist layer by exposing and developing the second photoresist layer;
forming two P-type heavily doped regions by performing P-type heavy doping on the two ends of the second active layer with the second gate electrode as a mask; wherein a region between the two P-type heavily doped regions in the second active layer forms a second channel region; and
stripping the residual second photoresist layer.

2. The method for manufacturing the display substrate according to claim 1, wherein said forming the first pattern layer by patterning the first photoresist layer to expose at least the two ends of the first active layer further comprises:
forming the first pattern layer by exposing and developing the first photoresist layer,
wherein the first pattern layer comprises a first photoresist layer complete removal region corresponding to the two ends of the first active layer, a first photoresist layer partial reservation region corresponding to the middle region of the first active layer, and a first photoresist layer complete reservation region corresponding to the second active layer.

3. The method for manufacturing the display substrate according to claim 2, wherein said forming the second pattern layer by processing the first pattern layer to expose at least the middle region of the first active layer further comprises:
ashing the first pattern layer by adopting a dry etching process to remove the first photoresist layer corresponding to the middle region of the first active layer; and
forming the second pattern layer by thinning a thickness of the first photoresist layer corresponding to the second active layer.

4. The method for manufacturing the display substrate according to claim 1, wherein the patterning the first metal layer further comprises:
coating a third photoresist layer on one side, facing away from the base substrate, of the first metal layer; and
forming a third pattern layer by exposing and developing the third photoresist layer;
wherein the third pattern layer comprises a third photoresist layer complete reservation region corresponding to the first gate and the second gate and a second photoresist layer complete removal region corresponding to the N-type heavily doped regions and inner sides of the N-type heavily doped regions.

5. The method for manufacturing the display substrate according to claim 4, wherein the forming the first source and the first drain on the one side, facing away from the base substrate, of the first active layer, wherein the first source and the first drain are electrically connected with the N-type heavily doped regions; and forming the second source and the second drain on the one side, facing away from the base substrate, of the second active layer, wherein the second source and the second drain are electrically connected with the P-type heavily doped regions comprises:
depositing an interlayer insulating layer on one side, facing away from the base substrate, of the first gate and on one side, facing away from the base substrate, of the second gate electrode;
forming first via holes arranged above the N-type heavily doped regions and second via holes arranged above the P-type heavily doped regions by patterning the interlayer insulating layer and the gate insulating layer;
depositing a second metal layer on one side, facing away from the base substrate, of the interlayer insulating layer; and
forming a first source, a first drain, a second source and a second drain by patterning the second metal layer;
wherein the first source and the first drain are electrically connected with the N-type heavily doped regions through the first via holes respectively, and the second source and the second drain are electrically connected with the P-type heavily doped regions through the second via holes respectively.

6. The method for manufacturing the display substrate according to claim 5, wherein before the coating the one side, facing away from the base substrate, of the first active layer and the one side, facing away from the base substrate, of the second active layer with the first photoresist layer, the method further comprises:
performing threshold voltage doping on the first active layer and the second active layer.

7. The method for manufacturing the display substrate according to claim 6, wherein the base substrate further comprises a PIN region; and the method further comprises:
forming a semiconductor layer arranged in the PIN region on the base substrate while forming the first active layer arranged in the NMOS transistor region and the second active layer arranged in the PMOS transistor region on the base substrate; and
performing threshold voltage doping on the semiconductor layer while performing threshold voltage doping on the first active layer and the second active layer.

8. The method for manufacturing the display substrate according to claim 7, wherein while forming the first pattern layer by patterning the first photoresist layer, the method further comprises:
exposing one end of the semiconductor layer; and
forming a first N-type heavily doped region by performing N-type heavy doping on the one end of the semiconductor layer, while forming the two N-type heavily doped regions by performing N-type heavy doping on the two ends of the first active layer with the first pattern layer as a mask.

9. The method for manufacturing the display substrate according to claim 8, wherein while forming the second pattern layer by processing the first pattern layer, the method further comprises:
exposing the remaining part of the semiconductor layer; and
performing channel doping on the semiconductor layer while performing channel doping on the first active layer by taking the second pattern layer as a mask.

10. The method for manufacturing the display substrate according to claim 9, wherein:
while performing N-type light doping on the first active layer, forming a first N-type lightly doped region by performing the N-type light doping on the semiconductor layer with the third pattern layer as a mask, wherein the N-type lightly doped region is arranged on inner sides of the first N-type heavily doped region.

11. The method for manufacturing the display substrate according to claim 10, wherein while forming the first gate and the second gate, the method further comprises:
forming a first electrode arranged on one side, facing away from the base substrate, of the semiconductor layer.

12. The method for manufacturing the display substrate according to claim 11, wherein while exposing and developing the second photoresist layer, the method further comprises:
forming a second photoresist layer complete reservation region corresponding to the first N-type lightly doped region and the first N-type heavily doped region on the second photoresist layer, and a second photoresist layer complete removal region corresponding to other regions of the semiconductor layer; and
while performing P-type heavy doping on the two ends of the second active layer, forming a first P-type heavily doped region by performing P-type heavy doping on an another one end of the semiconductor layer, wherein a region between the first N-type lightly doped region and the first P-type heavily doped region in the semiconductor layer forms an intrinsic region.

13. The method for manufacturing the display substrate according to claim 12, wherein while forming the first via holes and the second via holes by patterning the interlayer insulating layer and the gate insulating layer, the method further comprises:
forming a third via hole arranged above the first P-type heavily doped region, and a fourth via hole arranged above the first N-type heavily doped region.

14. The method for manufacturing the display substrate according to claim 1, wherein the first active layer and the second active layer are polycrystalline silicon layers, and the forming the first active layer arranged in the NMOS transistor region and the second active layer arranged in the PMOS transistor region on the base substrate comprises:
depositing an amorphous silicon layer on the base substrate;
converting the amorphous silicon layer into a polycrystalline silicon layer by adopting a low-temperature crystallization process; and
forming the first active layer arranged in the NMOS transistor region and the second active layer arranged in the PMOS transistor region by patterning the polycrystalline silicon layer.

15. The method for manufacturing the display substrate according to claim 1, wherein before the forming the first gate on the one side, facing away from the base substrate, of the first active layer, and the second gate located on the one side, facing away from the base substrate, of the second active layer, the method further comprises;
forming two N-type lightly doped regions by performing N-type light doping on the first active layer with the third pattern layer as a mask, wherein the two N-type lightly doped regions are respectively positioned on inner sides of the two N-type heavily doped regions, wherein a region positioned between the two N-type lightly doped regions in the first active layer forms a first channel region.

16. The method for manufacturing the display substrate according to claim 1, wherein the forming the first gate arranged on the one side, facing away from the base substrate, of the first active layer, and the second gate arranged on the one side, facing away from the base substrate, of the second active layer comprises:
forming the first gate and the second gate by etching the first metal layer with the third pattern layer as a mask.

17. The method for manufacturing the display substrate according to claim 5, wherein while forming the first source, the first drain, the second source and the second drain by patterning the second metal layer, the method further comprises:
forming a second electrode and a third electrode, wherein the second electrode is electrically connected with the first P-type heavily doped region through the third via hole, and the third electrode is electrically connected with the first N-type heavily doped region through the fourth via hole.

18. A method for manufacturing a display substrate, comprising:
providing a base substrate, wherein the base substrate comprises a Negative channel Metal Oxide Semiconductor (NMOS) transistor region and a Positive channel Metal Oxide Semiconductor (PMOS) transistor region;
forming a first active layer arranged in the NMOS transistor region and a second active layer arranged in the PMOS transistor region on the base substrate;
coating one side, facing away from the base substrate, of the first active layer and one side, facing away from the base substrate, of the second active layer with a first photoresist layer;
forming a first pattern layer by patterning the first photoresist layer to expose at least two ends of the first active layer;

forming N-type heavily doped regions by performing N-type heavy doping on the two ends of the first active layer with the first pattern layer as a mask;

forming a second pattern layer by processing the first pattern layer to expose at least a middle region of the first active layer;

performing channel doping on the first active layer by taking the second pattern layer as a mask;

forming P-type heavily doped regions by performing P-type heavy doping on two ends of the second active layer, after stripping the second pattern layer;

forming a first source and a first drain on one side, facing away from the base substrate, of the first active layer, wherein the first source and the first drain are electrically connected with the N-type heavily doped regions; and forming a second source and a second drain on one side, facing away from the base substrate, of the second active layer, wherein the second source and the second drain are electrically connected with the P-type heavily doped regions;

wherein the first active layer and the second active layer are polycrystalline silicon layers, and the forming the first active layer arranged in the NMOS transistor region and the second active layer arranged in the PMOS transistor region on the base substrate comprises:

depositing an amorphous silicon layer on the base substrate;

converting the amorphous silicon layer into a polycrystalline silicon layer by adopting a low-temperature crystallization process; and forming the first active layer arranged in the NMOS transistor region and the second active layer arranged in the PMOS transistor region by patterning the polycrystalline silicon layer.

* * * * *

UNITED STATES PATENT AND TRADEMARK OFFICE
CERTIFICATE OF CORRECTION

PATENT NO. : 12,094,954 B2  
APPLICATION NO. : 17/771720  
DATED : September 17, 2024  
INVENTOR(S) : Xinguo Wu et al.

Page 1 of 1

It is certified that error appears in the above-identified patent and that said Letters Patent is hereby corrected as shown below:

On the Title Page

Item (73), should read as follows:
(73) Assignees: Ordos Yuansheng Optoelectronics Co., Ltd., Ordos, Inner Mongolia (CN); BOE Technology Group Co., Ltd., Beijing (CN)

Signed and Sealed this
Twenty-second Day of October, 2024

Katherine Kelly Vidal
*Director of the United States Patent and Trademark Office*